US00RE41963E

(19) United States
(12) Reissued Patent
Yanai et al.

(10) Patent Number: US RE41,963 E
(45) Date of Reissued Patent: Nov. 30, 2010

(54) SEMICONDUCTOR MEMORY DEVICE

(75) Inventors: Tsuyoshi Yanai, Kawasaki (JP); Yoshio Kajii, Kawasaki (JP); Takashi Ohkawa, Kawasaki (JP)

(73) Assignee: Fujitsu Semiconductor Limited, Yokohama (JP)

(21) Appl. No.: 12/078,739

(22) Filed: Apr. 4, 2008

Related U.S. Patent Documents

Reissue of:
(64) Patent No.: 6,469,328
Issued: Oct. 22, 2002
Appl. No.: 09/398,012
Filed: Sep. 17, 1999

U.S. Applications:
(62) Division of application No. 10/968,819, filed on Oct. 20, 2004, now abandoned.

(30) Foreign Application Priority Data

Oct. 27, 1998 (JP) ..... 10-305888

(51) Int. Cl.
*H01L 27/10* (2006.01)

(52) U.S. Cl. ..... 257/207; 257/208; 257/211; 257/202; 257/401; 257/390; 257/903; 257/E27.098

(58) Field of Classification Search ..... 257/903, 257/390, 401, 202, 207, 208, 211, E27.098
See application file for complete search history.

(56) References Cited

U.S. PATENT DOCUMENTS

| | | | |
|---|---|---|---|
| 5,072,286 | A | 12/1991 | Minami |
| 5,097,440 | A | 3/1992 | Konishi et al. |
| 5,124,774 | A | 6/1992 | Godinho et al. |
| 5,422,840 | A | 6/1995 | Naiki |
| 5,436,506 | A | 7/1995 | Kim |
| 5,654,572 | A | 8/1997 | Kawase |
| 5,654,915 | A | 8/1997 | Stolmeijer et al. |
| 5,677,887 | A | 10/1997 | Ishibashi et al. |
| 5,744,844 | A | 4/1998 | Higuchi |
| 5,805,494 | A | 9/1998 | El-Kareh et al. |
| 5,841,153 | A | 11/1998 | Kuriyama et al. |
| 5,880,503 | A | 3/1999 | Matsumoto et al. |
| 5,930,163 | A | 7/1999 | Hara et al. |
| 5,965,922 | A | 10/1999 | Matsui |
| 5,977,597 | A | 11/1999 | Honda |
| 6,005,296 | A | 12/1999 | Chan |
| 6,091,629 | A | 7/2000 | Osada et al. |
| 6,147,385 | A | 11/2000 | Kim et al. |
| 6,160,298 | A | 12/2000 | Ohkubo |
| 6,239,500 | B1 | 5/2001 | Sugimachi |
| 6,274,895 | B1 | 8/2001 | Fujii et al. |

FOREIGN PATENT DOCUMENTS

| | | |
|---|---|---|
| EM | 0 578 915 | 1/1994 |
| JP | 2-209771 | 8/1990 |
| JP | 4-60991 | 2/1992 |
| JP | 404170069 | 6/1992 |
| JP | 4-351790 | 12/1992 |
| JP | 06-302785 | 10/1994 |
| JP | 6-310688 | 11/1994 |
| JP | 7-86436 | 3/1995 |
| JP | 07-130877 | 5/1995 |
| JP | 9-270468 A | 10/1997 |
| JP | 10-106269 | 4/1998 |
| JP | 10-125803 | 5/1998 |

*Primary Examiner*—Eugene Lee

(57) ABSTRACT

A semiconductor memory device is constructed to include a memory cell formed by a plurality of transistors, wherein each of gate wiring layers of all of the transistors forming the memory cell is arranged to extend in one direction.

5 Claims, 12 Drawing Sheets

SEMICONDUCTOR MEMORY DEVICE

Matter enclosed in heavy brackets [ ] appears in the original patent but forms no part of this reissue specification; matter printed in italics indicates the additions made by reissue.

*This application is a divisional of U.S. patent application Ser. No. 10/968,819 filed Oct. 20, 2004, which is a reissue of U.S. Pat. No. 6,469,328, issued Oct. 22, 2002, which claims benefits of Japanese Application Patent No. 10-305888 filed Oct. 27, 1998, the above applications are incorporated by reference herein their entireties.*

BACKGROUND OF THE INVENTION

1. Field of the Invention

The present invention generally relates to semiconductor memory devices, and more particularly to a semiconductor memory device such as a static random access memory (SRAM).

In semiconductor memory devices, memory cells occupy a large portion of the device area. Hence, the memory cell is an important factor which determines the size, access speed and power consumption of the semiconductor memory device.

2. Description of the Related Art

First, a description will be given of a memory cell of a conventional 1-read-write/1-read (1RW/1R) RAM. FIG. 1 is a circuit diagram showing a memory cell of a conventional 1RW/1R RAM. FIG. 2 is a diagram showing a layout of the memory cell of the conventional 1RW/1R RAM. FIG. 3 is a diagram for explaining various symbols used to indicate a gate polysilicon layer, a gate contact layer, a source/drain contact region, a source/drain region, a well contact region, a cell frame, a P-type well region, and an N-type well region in the layout shown in FIG. 2.

In FIG. 1, P-channel MOS transistors Trp1 and Trp2, N-channel MOS transistors Trn1 through Trn8, bit lines BLA, BLB, XBLA and XBLB, word lines WLA and WLB, and power lines VDD and VSS for respectively supplying power supply voltages VDD and VSS are coupled as shown.

In FIG. 2, gates of the transistors Trn3 and Trn4 are connected by a gate polysilicon layer 61, and gates of the transistors Trn5 and Trn7 are connected by a gate polysilicon layer 62. This is because the gates of the transistors Trn3 and Trn4 are connected to the same word line WLA, and the gates of the transistors Trn5 and Trn7 are connected to the same word line WLB, as may be seen from FIG. 1.

When the layout shown in FIG. 2 is employed, portions where the transistors are formed are inevitably separated and a large area is occupied thereby. That is, even among the N-channel MOS transistors which are of the same nMOS type, the source/drain regions are separated and an additional area is occupied thereby. More particularly, the cell frame shown in FIG. 2 is separated into the regions of the transistors Trn1 and Trn3, the transistors Trn2 and Trn4, the transistors Trn5 and Trn6, and the transistors Trn7 and Trn8.

On the other hand, since the gate polysilicon layer 61 of the transistors Trn3 and Trn4 cannot be arranged in the same direction as gate polysilicon layers 63 and 64 of the other transistors, the 1RW/1R RAM is easily affected by inconsistencies introduced during the production process of the memory cell. In other words, the dimensional accuracies of the gate polysilicon layers 61 and 62 and the gate polysilicon layers 63 and 64 which extend in different directions become different due to the inconsistencies introduced during the production process. For this reason, even if the gate polysilicon layers 61 and 62 are designed to have the same length as the gate polysilicon layers 63 and 64, for example, the actual resistances of the gate polysilicon layers 61 and 62 become different from the actual resistances of the gate polysilicon layers 63 and 64. As a result, the access speed and the power consumption of the memory cell are affected by the different resistances, and the balance of the memory cell as a whole deteriorates. Therefore, it is difficult to guarantee a stable operation of the semiconductor memory device.

As described above, in the conventional semiconductor memory device, there were problems in that it is difficult to reduce the area occupied by the memory cell, and that it is difficult to guarantee a stable operation of the semiconductor memory device due to the effects of the inconsistencies introduced during the production process.

SUMMARY OF THE INVENTION

Accordingly, it is a general object of the present invention to provide a novel and useful semiconductor memory device in which the problems described above are eliminated.

Another and more specific object of the present invention is to provide a semiconductor memory device which can reduce an area occupied by a memory cell and can guarantee a stable operation of the semiconductor memory device by minimizing effects caused by inconsistencies which are introduced during a production process of the semiconductor memory device.

Still another object of the present invention is to provide a semiconductor memory device comprising a memory cell formed by a plurality of transistors, wherein each of gate wiring layers of all of the transistors forming the memory cell is arranged to extend in one direction. According to the semiconductor memory device of the present invention, it is possible to reduce an area occupied by the memory cell, and to guarantee a stable operation of the semiconductor memory device by taking measures so as to be less affected by inconsistencies introduced during a production process of the semiconductor memory device.

Of the transistors forming the memory cell, first transistors which are coupled to word lines may be arranged on an outer side of second transistors which are coupled to a power supply, within the semiconductor memory device. In addition, of the second transistors, a source/drain of a second transistor coupled to the power supply and a substrate contact of the power supply may be used in common. Furthermore, of the second transistors, a source/drain of a second transistor coupled to another power supply which is different from the power supply and a substrate contact of the other power supply may be used in common. According to the semiconductor memory device of the present invention, it is possible to effectively reduce the area occupied by the memory cell by the transistor arrangement and the common use of the contact.

The first transistors and the second transistors which are coupled to the power supply are made of N-channel MOS transistors, and the second transistor which is coupled to the other power supply may be made of a P-channel MOS transistor.

The semiconductor memory device may further comprise signal lines including word lines, and a power line, where the power line is arranged between the signal lines in a single wiring layer. According to the semiconductor memory device of the present invention, it is possible to reduce the coupling capacitance introduced between the signal lines, and prevent generation of noise and inversion (transformation) of data.

A plurality of memory cells may be arranged in an array, an adjacent memory cell may be arranged adjacent to a certain memory cell, and a source/drain of the transistors forming the adjacent memory cell and a bulk layer of a substrate contact may be used in common by reversing a layout of the certain cell with respect to both an x-axis direction and a y-axis direction. In addition, the semiconductor memory device may further comprise power lines, and signal lines, where a plurality of memory cells are arranged in an array, an adjacent memory cell is arranged adjacent to a certain memory cell, and the power lines and the signal lines with respect to the adjacent memory cell are used in common with the certain memory cell by reversing a layout of the certain memory cell with respect to both an x-axis direction and a y-axis direction. According to the semiconductor memory device of the present invention, it is possible to effectively reduce the area occupied by the memory cell array.

Other objects and further features of the present invention will be apparent from the following detailed description when read in conjunction with the accompanying drawings.

BRIEF DESCRIPTION OF THE INVENTION

DESCRIPTION OF THE PREFERRED EMBODIMENTS

A description will be given of embodiments of the present invention, by referring to FIG. 4 and the subsequent figures.

Figure 1:
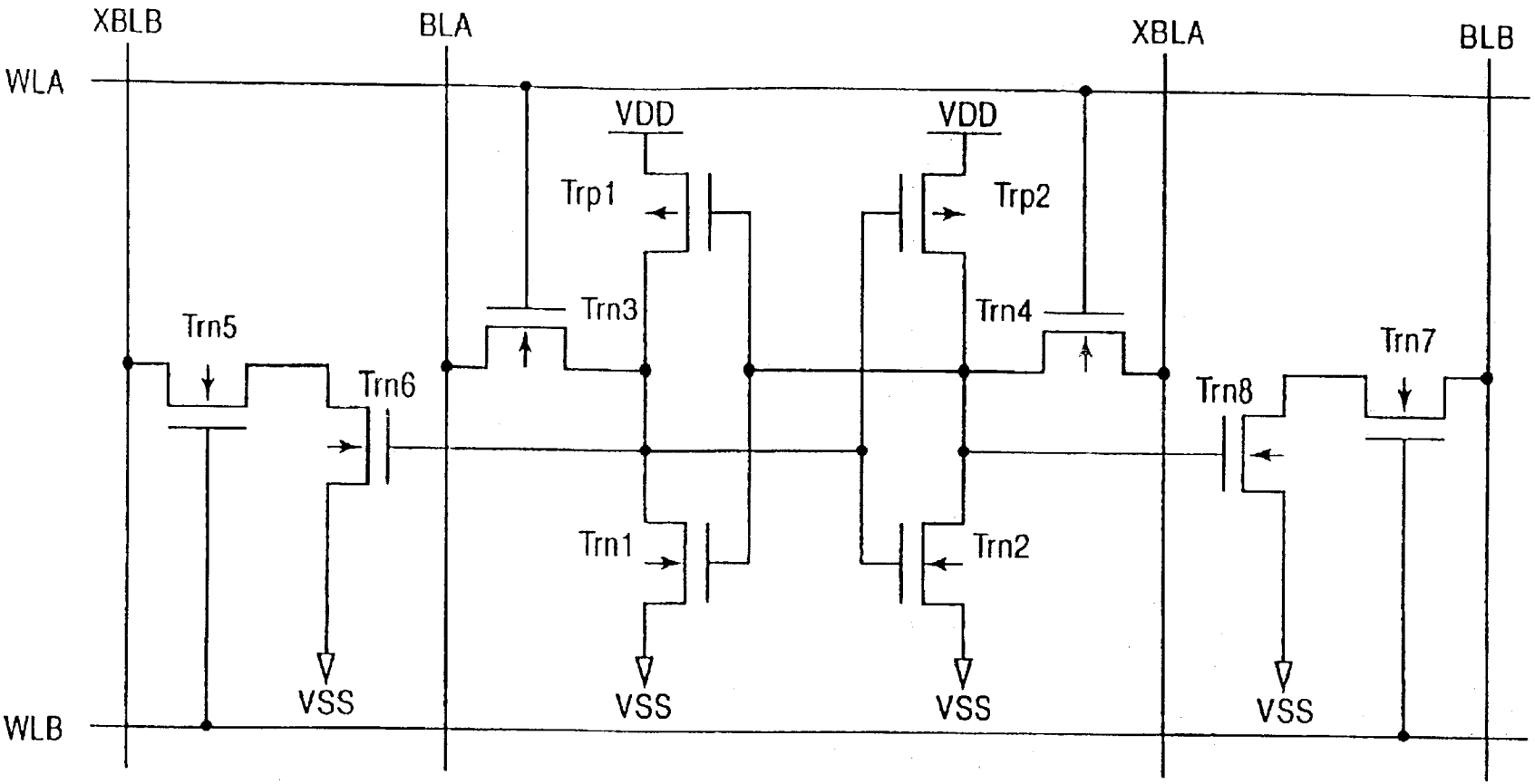
FIG. 1 PRIOR ART
FIG. 1 is a circuit diagram showing a memory cell of a conventional 1RW/1R RAM.
Figure 4:
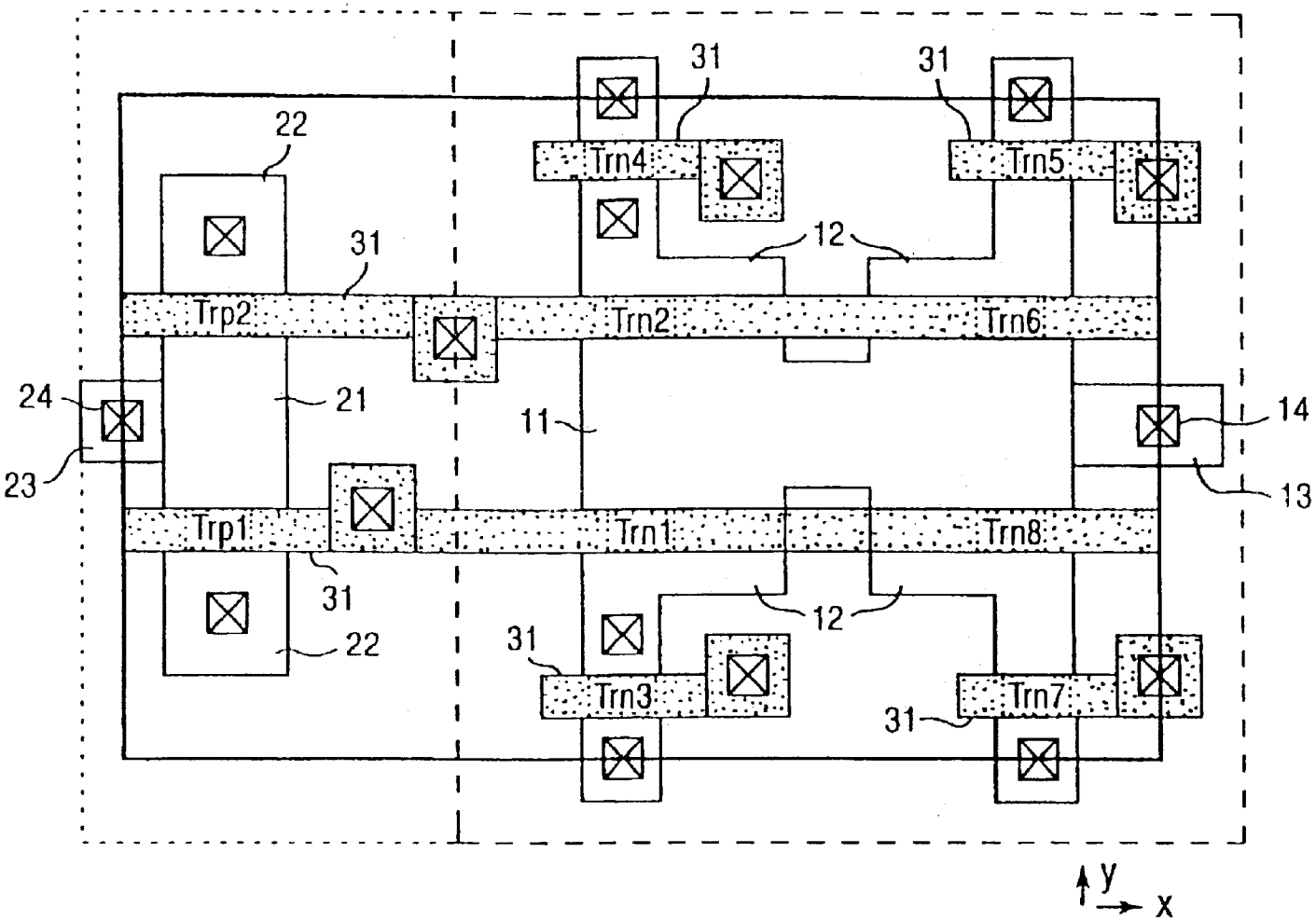
FIG. 4 is a diagram showing a layout of a memory cell of a first embodiment of a semiconductor memory device according to the present invention.
Figure 5:
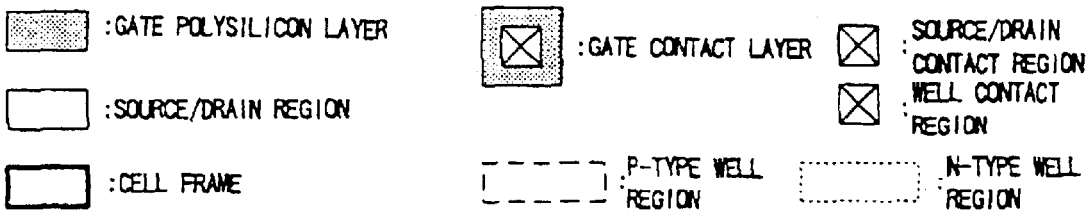
FIG. 5 is a diagram for explaining various symbols used in FIG. 4.

FIG. 4 is a diagram showing a layout of a memory cell of a first embodiment of a semiconductor memory device according to the present invention. FIG. 5 is a diagram for explaining various symbols used to indicate a gate polysilicon layer, a gate contact layer, a source/drain contact region, a source/drain region, a well contact region, a cell frame, a P-type well region, and an N-type well region in the layout shown in FIG. 4. In this embodiment, the present invention is applied to a 1RW/1R RAM. The illustration of the circuit diagram of the memory cell of the 1RW/1R RAM will be omitted since the circuit diagram is the same as that of the conventional memory cell shown in FIG. 1. In FIG. 4, those parts which are the same as those corresponding parts in FIG. 1 are designated by the same reference numerals, and a description thereof will be omitted.

In this embodiment, the transistors Trn3 and Trn4 which are connected to the word line WLA and the transistors Trn5 and Trn7 which are connected to the word lines WLB are arranged on the outer side of the other transistors in the cell frame, as shown in FIG. 4. More particularly, the transistors Trn4 and Trn5 are arranged in an upper portion in FIG. 4, while the transistors Trn3 and Trn7 are arranged in a lower portion in FIG. 4. Hence, it is possible to use common sources/drains 11 and 12 with respect to the transistors Trn1, Trn2, Trn6 and Trn8.

In other words, the power supply sides VSS (sources 11) of the transistors Trn1; Trn2, Trn6 and Trn8 may be used in common, and by further common use with substrate contacts (contact regions of the P-type wells) 13, it is possible to reduce the number of contacts 14 to the power supply VSS to one. In addition, common sources/drains 21 and 22 may be used with respect to the transistors Trp1 and Trp2. By similarly using the power supply sides VDD (sources 21) of the transistors Trp1 and Trp2 in common, and by further common use with substrate contacts (contact regions of the N-type wells) 23, it is possible to reduce the number of contacts 24 to the power supply VDD to one.

Figure 2:
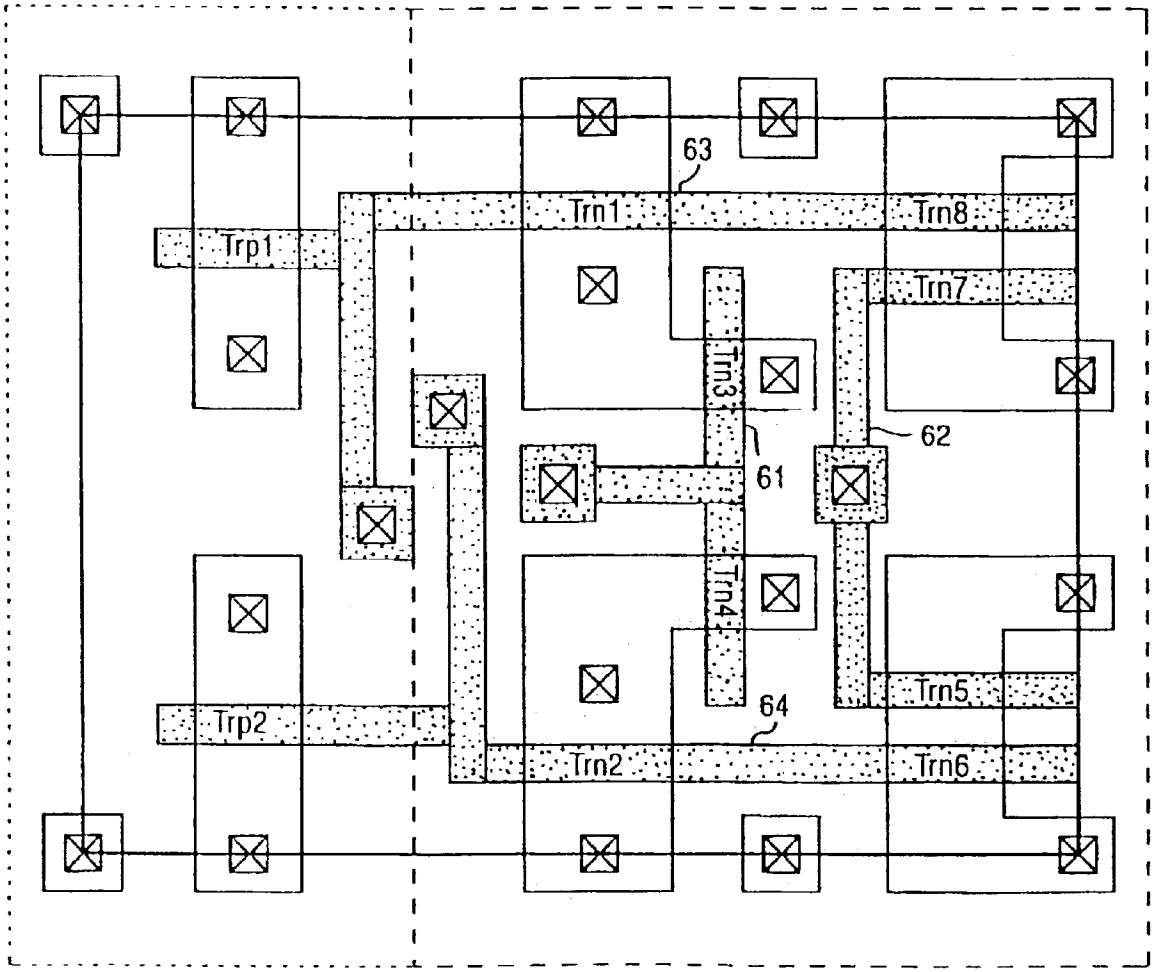
FIG.2 PRIOR ART
FIG. 2 is a diagram showing a layout of the memory cell of the conventional 1RW/1R RAM.
Figure 3:
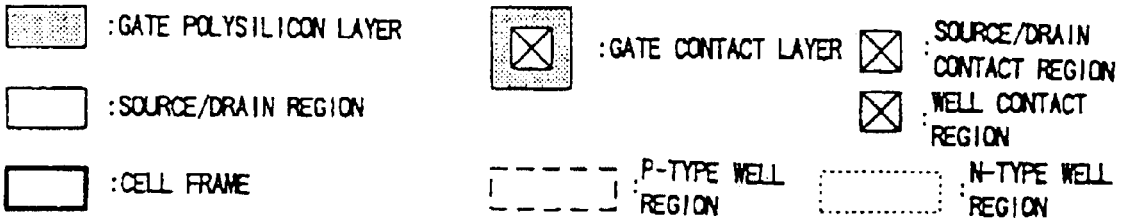
FIG. 3 is a diagram for explaining various symbols used in FIG. 2.

Accordingly, the conventional concept of using a polysilicon layer to connect the gates of the transistors which are connected to the word lines as shown in FIG. 2 is totally discarded in this embodiment. Instead, this embodiments arranges the transistors Trp1, Trp2 and Trn1 through Trn8 as shown in FIG. 4, so that gate polysilicon layers 31 of all of the transistors Trp1, Trp2 and Trn1 through Trn8 extend in the same direction. As a result, this embodiment is less affected by the inconsistencies introduced during the production process of the memory cell.

The present inventors conducted experiments to compare the layout of this embodiment shown in FIG. 4 and the conventional layout shown in FIG. 2. It was confirmed from the results of the experiments that the area of one memory cell of this embodiment can be reduced by approximately 20% as compared to the area of one conventional memory cell.

As will be described later in conjunction with FIG. 6, contact regions in the cell frame can be used in common by arranging the layouts of the adjacent memory cells in a reverse arrangement with respect to both an X-axis direction and a y-axis direction. In other words, contact regions 13, 23 and 43 of the memory cells can be used in common among a certain memory cell and adjacent memory cells arranged above, below, to the right and left of the certain memory cell.

Figure 6:
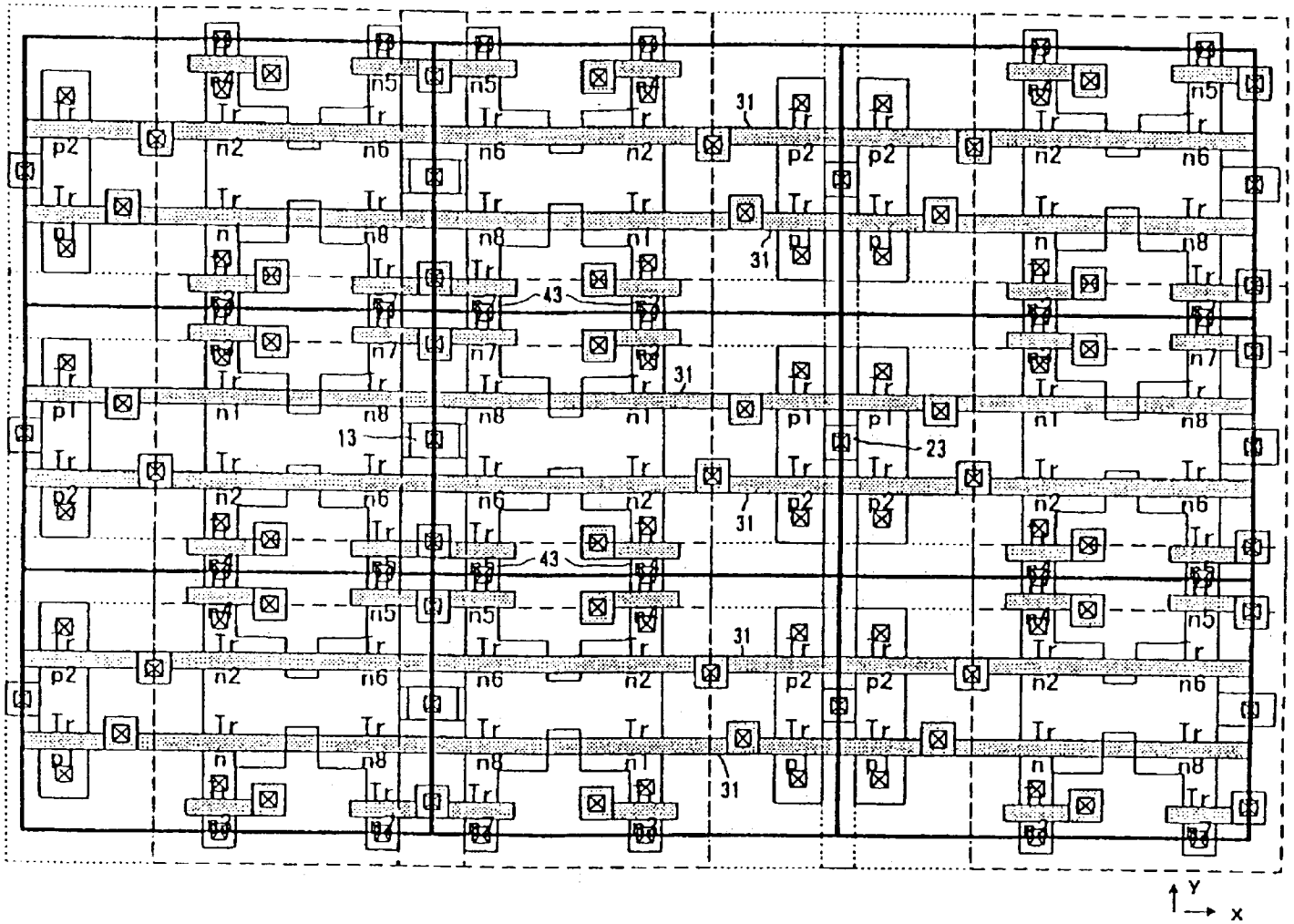
FIG. 6 is a diagram showing a layout for a case where 8 memory cells are arranged around one memory cell shown in FIG. 4.

FIG. 6 is a diagram showing a layout in which 8 adjacent memory cells are arranged around one certain memory cell having the layout shown in FIG. 4. In FIG. 6, those parts which are the same as those corresponding parts in FIGS. 4 and 5 are designated by the same reference numerals and symbols, and a description thereof will be omitted. In FIG. 6, however, the reference numerals of the transistors Trp1, Trp2 and Trn1 through Trn8 are divided into upper and lower portion, such as "Tr" and "p1", because of the limited writing space available within the figure.

As may be seen from FIG. 6, when the layout of the adjacent memory cells are reversed, or turned over relative to the layout of the certain memory cell with respect to both the x-axis direction an the y-axis direction, when arranging the memory cells in an array, that is, in a form of a memory cell array, it is possible to use the sources/drains and a bulk layer of substrate contacts in common among the memory cells. The bulk layer refers to a stacked structure from a substrate to a layer under a first metal layer which will be described later. In addition, by reversing the layout of the adjacent memory cells relative to the layout of the certain memory cell with respect to both the x-axis direction and the y-axis direction, it is also possible to use power lines such as the power lines VDD and VSS, and signal lines such as the word lines WLA and WLB, the bit lines BLA and BLB, XBLA and XBLB in common among the memory cells.

In other words, the gate polysilicon layers of all of the transistors forming the memory cells are arranged to extend in the same direction In addition, the sources/drains of the transistors connected to all of the bit lines are arranged to be used in common among the certain memory cell and the adjacent memory cells located above and below in the plan view. Moreover, the sources/drains of the transistors on the power supply side and the substrate contacts are used in common among the memory cells. Furthermore, the substrate contacts are used in common among the certain memory cell and the adjacent memory cells located on the right and left.

Figure 7:
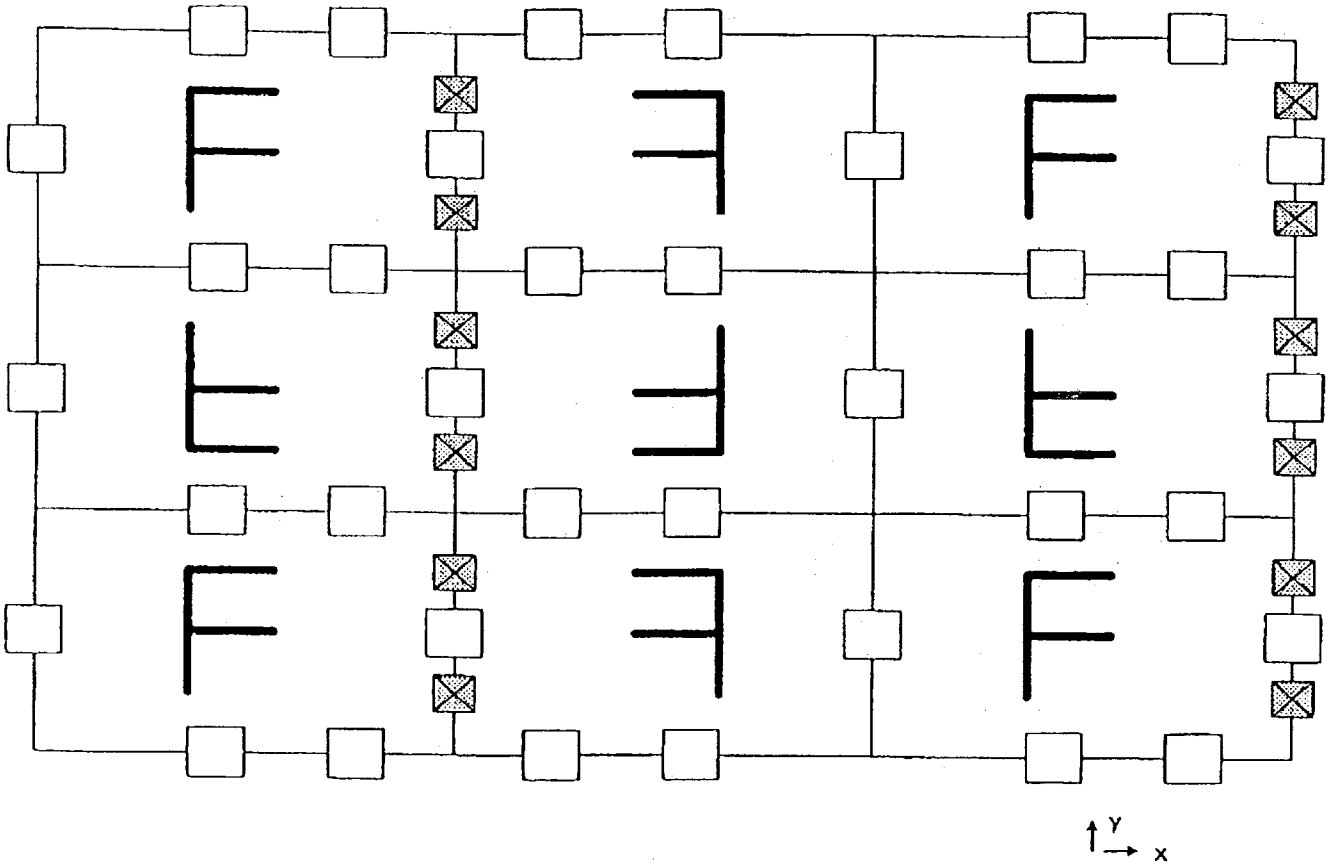
FIG. 7 is a diagram showing the layout shown in FIG. 6 in a simplified manner.
Figure 8:
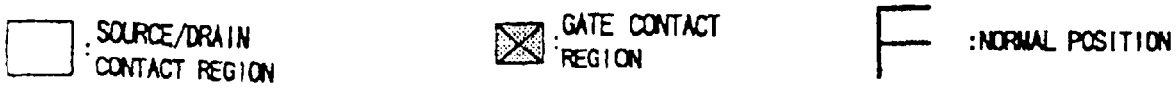
FIG. 8 is a diagram for explaining various symbols used in FIG. 7.

FIG. 7 is a diagram showing the layout shown in FIG. 6 in a simplified manner. FIG. 8 is a diagram for explaining various symbols used to indicate a source/drain contact region, a gate contact region, and a normal position of the memory cell in the layout shown in FIG. 7. As may be seen from FIG. 7, the effect of reducing the area occupied by the memory cells becomes more notable as the number of memory cells in the memory cell array increases.

In FIG. 6, it is assumed for the sake of convenience that the area of each memory cell is the area within each cell frame. However, a region actually occupied by each memory extends slightly to the outer side of each cell frame. Hence, in units of the cell region which is actually occupied by each memory cell, the cell regions actually occupied by each of the memory cells overlap among the mutually adjacent cell regions according to the layout of the memory cells shown in FIG. 6. Consequently, it is actually possible to further reduce the area of each memory cell by an amount corresponding to the overlap of the cell regions of the adjacent memory cells.

Figure 9:
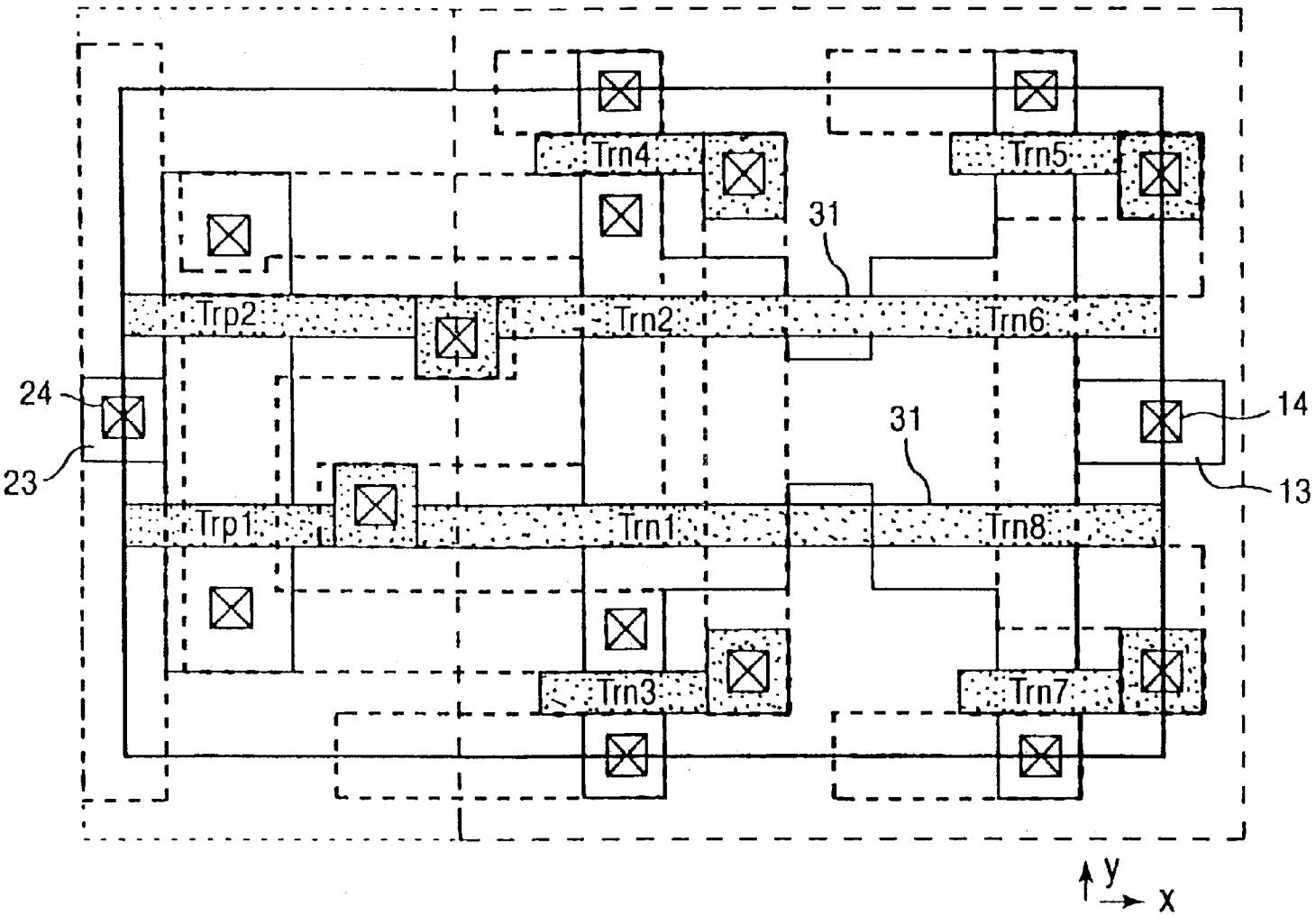
FIG. 9 is a diagram showing a layout of a memory cell of a second embodiment of the semiconductor memory device according to the present invention.
Figure 10:
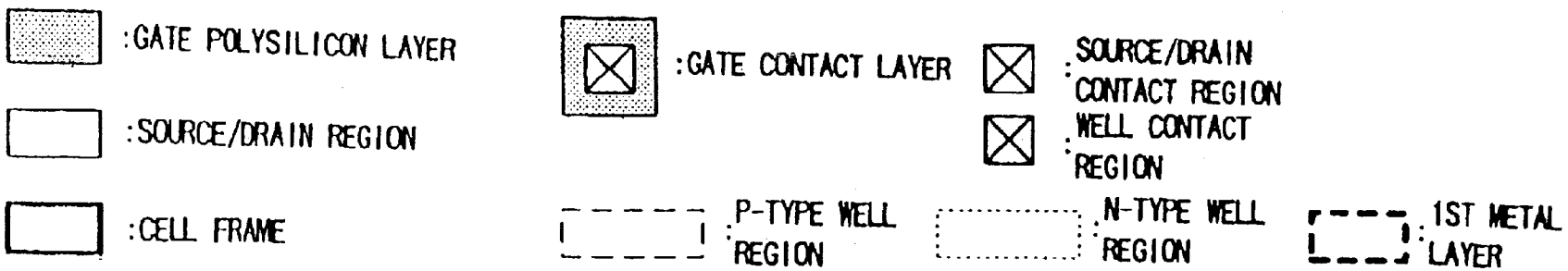
FIG. 10 is a diagram for explaining various symbols used in FIG. 9.
Figure 11:
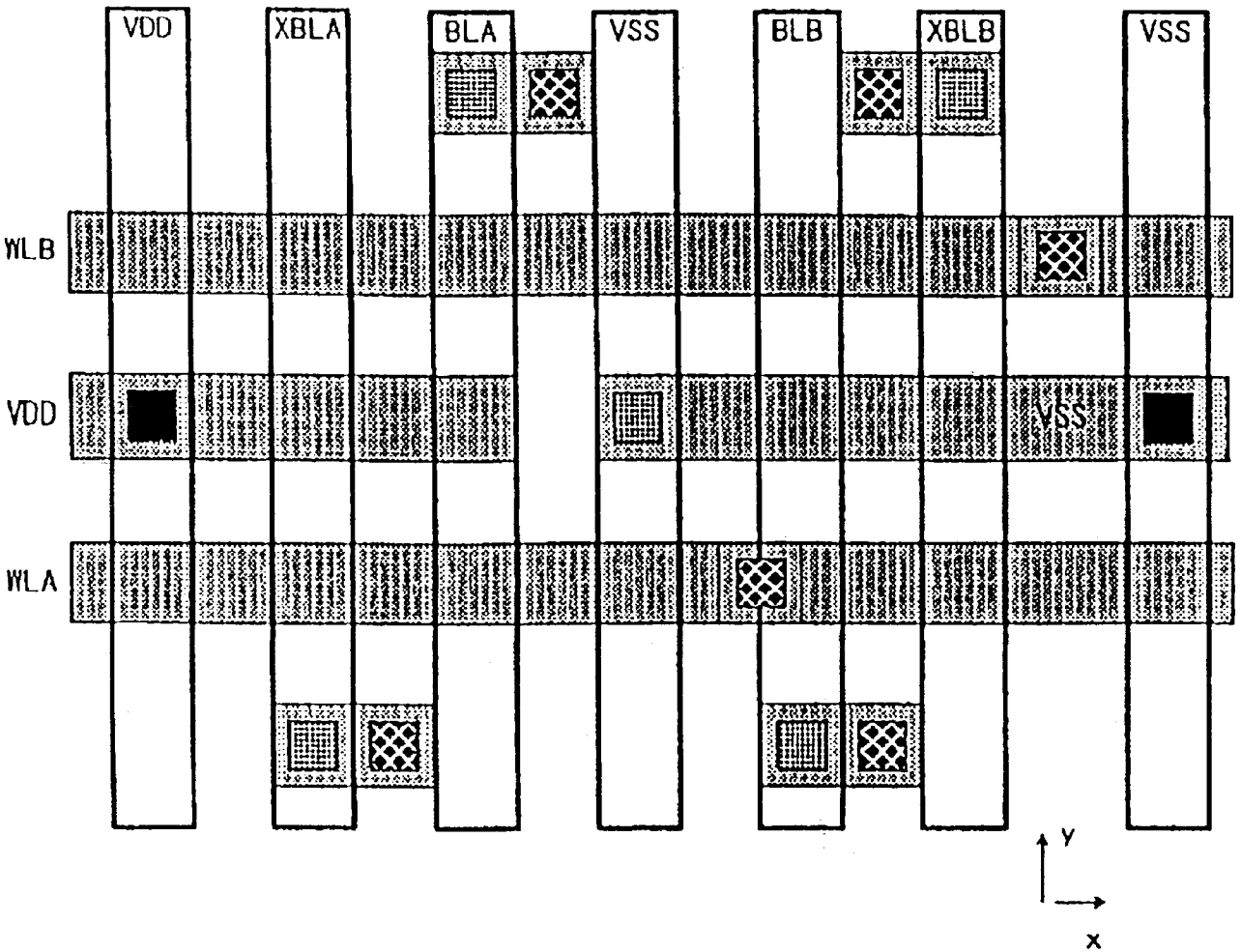
FIG. 11 is a diagram showing a layout of power lines in the second embodiment.
Figure 12:
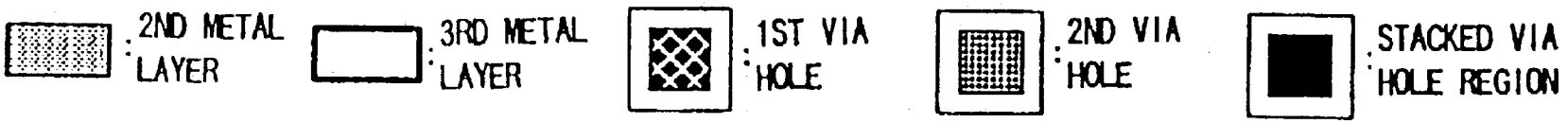
FIG. 12 is a diagram for explaining various symbols used in FIG. 11.

FIG. 9 is a diagram showing a layout of a memory cell of a second embodiment of the semiconductor memory device according to the present invention. FIG. 10 is a diagram showing various symbols used to indicate a gate polysilicon layer, a gate contact layer, a source/drain contact region, a source/drain region, a well contact region, a cell frame, a P-type well region, an N-type well region, and a first metal layer of the layout shown in FIG. 9. In addition, FIG. 11 is a diagram showing a layout of power lines in this embodiment. FIG. 12 is a diagram showing various symbols used to indicate a second metal layer, a third metal layer, a first via hole, a second via hole, and a stacked via hole region in the layout shown in FIG. 11. In this embodiment, the present invention is also applied to a 1RW/1R RAM. The illustration of the circuit diagram of the memory cell of the 1RW/1R RAM will be omitted since the circuit diagram is the same as that of the conventional memory cell shown in FIG. 1. In FIG. 9, those parts which are the same as those corresponding parts in FIG. 4 are designated by the same reference numerals, and a description thereof will be omitted.

As may be seen from FIGS. 9 and 11, similarly to the power line VSS which is arranged between the bit lines BLA and BLB in the same wiring layer (wiring level of the third metal layer), the power lines VDD and VSS are arranged between the word lines WLA and WLB in the same wiring layer (wiring level of the second metal layer). In other words, by arranging the power line so as to be sandwiched between the signal lines in the same wiring layer, it is possible to reduce the coupling capacitance generated between the signal lines, and to prevent generation of noise and inversion (transformation) of data. As a result, it is possible to reduce the coupling capacitance between ports of the 1RW/1R RAM which is a multi-port RAM, and accordingly, prevent interference between the ports.

In the embodiments described above, the present invention is applied to the 1RW/1R RAM. However, the application of the present invention is not limited to the 1RW/1R RAM, and the present invention is similarly applicable to various other kinds of semiconductor memory devices.

Further, the present invention is not limited to these embodiments, but various variations and modifications may be made without departing from the scope of the present invention.

What is claimed is:

[1. A semiconductor memory device comprising:

a memory cell formed by a plurality of transistors, gate wiring layers of all of the transistors forming said memory cell being arranged to extend in one direction, wherein: of the transistors forming said memory cell, first transistors which are coupled to word lines are arranged on an outer side of second transistors which are coupled to a power supply, within the memory cell, and the gate wiring layers of at least two of said second transistors which are coupled to the power supply are connected to each other, a plurality of power lines, a first one of which running within the memory cell, two word lines running on both sides of the first power line, a second power line intersecting the first power line, and two bit line pairs running on both sides of the second power line; and wherein a plurality of memory cells are arranged in an array, an adjacent memory cell is arranged adjacent to a certain memory cell, and a source/drain of the transistor, forming said adjacent memory cell and a bulk layer of a substrate contact are used in common by reversing a layout of said certain cell with respect to both an x-axis direction and a y-axis direction.]

[2. The semiconductor memory device as claimed in claim 1, wherein: of said second transistors, a source/drain of a second transistor coupled to the power supply and a substrate contact of the power supply are used in common.]

[3. The semiconductor memory device as claimed in claim 1, wherein: of said second transistors, a source/drain of a second transistor coupled to another power supply which is different from said power supply and a substrate contact of the other power supply are used in common.]

[4. The semiconductor memory device as claimed in claim 3, wherein said first transistors and said second transistors which are coupled to said power supply are made of N-channel MOS transistors, and said second transistor which is coupled to said other power supply is made of a P-channel MOS transistor.]

[5. The semiconductor memory device as claimed in claim 1, which further comprises:

signal lines including word lines; and wherein said power lines are arranged between said signal lines in a single wiring layer.]

[6. A semiconductor memory device comprising:

a memory cell formed by a plurality of transistors, gate wiring layers of all of the transistors forming said memory cell being arranged to extend in one direction, wherein: of the transistors forming said memory cell, first transistors which are coupled to word lines are arranged on an outer side of second transistors which are coupled to a power supply, within the memory cell, the gate wiring layers of at least two of said second transistors which are coupled to the power supply are connected to each other, a plurality of power lines, a first one of which running within the memory cell, a plurality of signal lines, two word lines running on both sides of the first power line, a second power line intersecting the first power line, two bit line pairs running on both sides of the second power lines;

a plurality of memory cells being arranged in an array, and an adjacent memory cell being arranged adjacent to a certain memory cell, said power lines and said signal lines with respect to said adjacent memory cell are used in common with said certain memory cell by reversing a layout of said certain memory cell with respect to both an x-axis direction and a y-axis direction.]

[7. The semiconductor memory device as claimed in claim 1, wherein said plurality of memory cells arranged in an array, said adjacent memory cell arranged adjacent to a certain memory cell, and said source/drain of the transistors forming said adjacent memory cell and said bulk layer of a substrate contact are used in common on all four adjacent sides by reversing a layout of said certain cell with respect to both an x-axis direction and a y-axis direction.]

[8. The semiconductor memory device as claimed in claim 1, wherein said plurality of memory cells arranged in an array, said adjacent memory cell arranged adjacent to a certain memory cell, and said power lines with respect to said adjacent memory cell are used in common with said certain memory cell by reversing a layout of said certain memory cell with respect to an x-axis direction.]

[9. The semiconductor memory device as claimed in claim 6, wherein: of said second transistors, a source/drain of a second transistor coupled to the power supply and a substrate contact of the power supply are used in common.]

[10. The semiconductor memory device as claimed in claim 6, wherein: of said second transistors, a source/drain of a second transistor coupled to another power supply which is different from said power supply and a substrate contact of the other power supply are used in common.]

[11. The semiconductor memory device as claimed in claim 10, wherein said first transistors and said second transistors which are coupled to said power supply are made of N-channel MOS transistors, and said second transistor which is coupled to said other power supply is made of a P-channel MOS transistor.]

[12. The semiconductor memory device as claimed in claim 6, wherein said signal lines include word lines; and said power lines are arranged between said signal lines in a single wiring layer.]

[13. The semiconductor memory device as claimed in claim 6, wherein said plurality of memory cells arranged in an array, said adjacent memory cell arranged adjacent to a certain memory cell, and a source/drain of the transistor forming said adjacent memory cell and a bulk layer of a substrate contact are used in common on all four adjacent sides by reversing a layout of said certain cell with respect to both an x-axis direction and a y-axis direction.]

[14. The semiconductor memory device as claimed in claim 6, wherein said plurality of memory cells arranged in an array, said adjacent memory cell arranged adjacent to a certain memory cell, and said power lines with respect to said adjacent memory cell are used in common with said certain memory cell by reversing a layout of said certain memory cell with respect to an x-axis direction.]

*15. A semiconductor device comprising:*

*a plurality of SRAM memory cells each formed by first and second P-channel transistors and first through fourth N-channel transistors;*

*first and second bit lines;*

*a word line;*

*first and second power lines;*

*a first wiring layer forming a gate of the first P-channel transistor and a gate of the first N-channel transistor;*

*a second wiring layer forming a gate of the second P-channel transistor and a gate of the second N-channel transistor;*

*a third wiring layer forming a gate of the third N-channel transistor that is coupled to the word line; and*

*a fourth wiring layer forming a gate of the fourth N-channel transistor that is coupled to the word line,*

*said first through fourth wiring layers extending linearly and in parallel along an x-axis direction,*

*each of the first and second P-channel transistors having a source/drain with a first contact that couples to the first power line;*

*each of the first and second N-channel transistors having a source/drain with a second contact that couples to the second power line,*

*the third N-channel transistor having a source/drain with a third contact that couples to the first bit line,*

*the fourth N-channel transistor having a source/drain with a fourth contact that couples to the second bit line,*

*said first through fourth contacts being used in common by adjacent memory cells,*

*each of the first and second power lines being arranged between the first and second bit lines such that the first and second power lines and the first and second bit lines are mutually parallel,*

*said word line being disposed above the first through fourth wiring layers and extending in the x-axis direction,*

*each of the first and second power lines and the first and second bit lines being disposed above the word line and extending in a y-axis direction that is perpendicular to the x-axis direction,*

*the adjacent memory cells having layouts that are reversed in the x-axis direction or the y-axis direction.*

*16. A semiconductor device comprising:*

*a plurality of SRAM memory cells each formed by first and second P-channel transistors and first through fourth N-channel transistors;*

*first and second bit lines;*

*a word line;*

*first and second power lines;*

*a first wiring layer forming a gate of the first P-channel transistor and a gate of the first N-channel transistor;*

*a second wiring layer forming a gate of the second P-channel transistor and a gate of the second N-channel transistor;*

*a third wiring layer forming a gate of the third N-channel transistor; and*

*a fourth wiring layer forming a gate of the fourth N-channel transistor,*

*said first through fourth wiring layers extending linearly and in parallel along an x-axis direction,*

*said third and fourth wiring layers being coupled to the word line,*

*each of the first and second P-channel transistors having a source/drain with a first contact that couples to the first power line;*

*each of the first and second N-channel transistors having a source/drain with a second contact that couples to the second power line,*

*the third N-channel transistor having a source/drain with a third contact that couples to the first bit line,*

*the fourth N-channel transistor having a source/drain with a fourth contact that couples to the second bit line,*

*said first through fourth contacts being used in common by adjacent memory cells,*

*each of the first and second power lines being arranged between the first and second bit lines such that the first and second power lines and the first and second bit lines are mutually parallel,*

*said word line being disposed above the first through fourth wiring layers and extending in the x-axis direction,*

*each of the first and second power lines and the first and second bit lines being disposed above the word line and extending in a y-axis direction that is perpendicular to the x-axis direction,*

*the adjacent memory cells having layouts that are reversed in the x-axis direction or the y-axis direction.*

*17. A semiconductor device comprising:*

*a plurality of SRAM memory cells each formed by first and second P-channel transistors and first through fourth N-channel transistors;*

*first and second bit lines;*

*a word line;*

*first and second power lines;*

*a first wiring layer forming a gate of the first P-channel transistor and a gate of the first N-channel transistor;*

*a second wiring layer forming a gate of the second P-channel transistor and a gate of the second N-channel transistor;*

*a third wiring layer forming a gate of the third N-channel transistor; and*

*a fourth wiring layer forming a gate of the fourth N-channel transistor,*

*said first through fourth wiring layers extending linearly and in parallel along an x-axis direction,*

*said third and fourth wiring layers being extending linearly to adjacent memory cells that are adjacent to each other along the x-axis direction and being used in common by the adjacent memory cells that are adjacent to each other along the x-axis direction,*

*said third N-channel transistor having a source/drain which is used in common as a first bit line contact by adjacent memory cells that are adjacent to each other along a y-axis direction that is perpendicular to the x-axis direction,*

*said fourth N-channel transistor having a source/drain which is used in common as a second bit line contact by the adjacent memory cells that are adjacent to each other along the y-axis direction,*

*said third and fourth wiring layers being coupled to word line,*

*each of the first and second power lines being arranged between the first and second bit lines such that the first and second power lines and the first and second bit lines are mutually parallel,*

*said word line being disposed above the first through fourth wiring layers and extending in the x-axis direction,*

*each of the first and second power lines and the first and second bit lines being disposed above the word line and extending in the y-axis direction,*

*the adjacent memory cells having layouts that are reversed in the x-axis direction or the y-axis direction.*

*18. The semiconductor device as claimed in claim 17, wherein each of the first and second P-channel transistors has a source/drain with a first contact that couples to the first power line, and each of the first and second N-channel transistors has a source/drain with a second contact that couples to the second power line.*

*19. The semiconductor device as claimed in claim 18, wherein each of the first and second contacts is used in common by adjacent memory cells.*

* * * * *